United States Patent [19]

Nativi

[11] 4,424,252
[45] Jan. 3, 1984

[54] CONFORMAL COATING SYSTEMS

[75] Inventor: Larry A. Nativi, Rocky Hill, Conn.

[73] Assignee: Loctite Corporation, Newington, Conn.

[21] Appl. No.: 441,117

[22] Filed: Nov. 12, 1982

[51] Int. Cl.$^3$ .............................................. B05D 3/06
[52] U.S. Cl. .............................. 428/209; 204/159.19; 427/44; 427/54.1; 428/901
[58] Field of Search .............................. 427/54.1, 44; 204/159.16, 159.19; 428/209, 901

[56] References Cited

U.S. PATENT DOCUMENTS

| | | | |
|---|---|---|---|
| 3,437,514 | 4/1969 | Burlant | 117/93.31 |
| 3,652,333 | 3/1972 | Warren | 117/218 |
| 3,959,521 | 5/1976 | Suetsugi et al. | 427/44 |
| 3,979,426 | 9/1976 | Demajistre | 260/404.5 |
| 3,989,609 | 11/1976 | Brack | 204/159.15 |
| 4,013,806 | 3/1977 | Volkert | 427/54 |
| 4,017,649 | 4/1977 | DeMajistre | 427/44 |
| 4,025,407 | 4/1977 | Chang et al. | 204/159.14 |
| 4,082,634 | 4/1978 | Chang | 427/54.1 |
| 4,086,373 | 4/1978 | Tobias et al. | 427/44 |
| 4,091,122 | 5/1978 | Davis et al. | 427/44 |
| 4,122,225 | 10/1978 | Holmstrom et al. | 428/172 |
| 4,128,600 | 12/1978 | Skinner et al. | 260/859 |
| 4,137,084 | 1/1979 | Davis et al. | 102/21 |
| 4,138,299 | 2/1979 | Bolgiano | 204/159.16 |
| 4,161,556 | 4/1979 | Lenard et al. | 427/385 A |
| 4,173,682 | 11/1979 | Noomen et al. | 427/44 |
| 4,176,212 | 11/1979 | Brack | 427/54.1 |
| 4,199,421 | 4/1980 | Kamada et al. | 204/159.22 |
| 4,203,792 | 5/1980 | Thompson | 427/53.1 |
| 4,204,010 | 5/1980 | Kramm et al. | 427/44 |
| 4,208,005 | 6/1980 | Nate et al. | 427/44 |
| 4,212,901 | 7/1980 | van Neerbos et al. | 427/53.1 |
| 4,224,357 | 9/1980 | Iwai et al. | 427/44 |
| 4,247,578 | 1/1981 | Skinner | 427/44 |
| 4,377,457 | 3/1983 | Boeckeler et al. | 204/159.16 |

OTHER PUBLICATIONS

Clyde F. Coombs, Jr., Printed Circuit Handbook, 1979 Second Edition, pp. 12-1 to 12-9.

Primary Examiner—John H. Newsome
Attorney, Agent, or Firm—Hayes, Davis & Soloway

[57] ABSTRACT

Ultraviolet curable polymerizable coating system having one or more built-in secondary curing mechanisms is disclosed. The polymerizable coating system is a two component system comprising (1) a first component comprising at least one urethane-acrylate or methacrylate, and a mono or polyfunctional acrylate or methacrylate diluent and a polymerization initiator of the photo-initiator type, and (2) a second component comprising a polyisocyanate. The coating system is uv curable, and also possess at least one additional cure mechanism.

15 Claims, No Drawings

CONFORMAL COATING SYSTEMS

This invention concerns polymerizable compositions which have their primary utility in the area of coatings and sealants. The invention has particular utility in the area of conformal coatings for printed circuit boards and electronic components and will be described in connection with such utility, although other uses are contemplated.

Printed circuit boards and electronic components may be coated with a protective film to avoid or at least minimize degradation in electrical performance due to contamination. The most damaging, and usually the most prevalent contaminant generally is considered to be moisture or humidity. Excessive moisture or humidity will drastically lower insulation resistance between conductors, accelerate high-voltage breakdown and dendritic growth, and corrode conductors. Other contaminants which may damage printed circuit boards include various chemicals which may be residues of the manufacturing process such as fluxes, organic solvents, release agents, metal particles and marking inks, and contaminants which inadvertently may be deposited by human handling such as body greases, fingerprints, cosmetics and food stains. Ambient operating conditions may also contribute a variety of contaminants such as salt spray, dirt and dust, oil, fuel, acid, corrosive vapor and fungus. Although the list of possible contaminants is almost endless, in all but the most severe cases, their destructive action effectively can be eliminated by provision of a good conformal coating.

In addition to providing protection from contaminants, conformal coatings also provide a certain degree of protection to mechanical shock, vibration and tampering.

Various conformal coating systems are known in the art and are available commercially. Each has its advantages and disadvantages. One such prior art conformal coating system is based on acrylics. Acrylics are excellent coating systems from a production standpoint because they readily may be applied by spraying or brushing. Acrylic coatings have desirable electrical and physical properties and are fungus resistant. Additional advantages of acrylic coatings include long life, low or no exotherm during cure, and little or no shrinkage during cure. However, acrylic coatings typically are formed by solvent evaporation and reach optimum physical characteristics during cure typically in a matter of minutes. Conventional acrylic coatings are soluble in chlorinated solvents such as tricholorethane or methylene chloride.

Another prior art conformal coating system is based on polyurethanes. Polyurethanes are available as either single or two-component systems. Polyurethane coatings offer excellent humidity and chemical resistance and good dielectric properties. Single-component urethanes are relatively easy to apply and exhibit relatively long working pot life. However, single-component polyurethanes typically require a curing time of three to ten days at room temperature to reach optimum physical characteristics. Two-component polyurethanes typically achieve optimum cure at elevated temperatures within one to three hours, but exhibit relatively short working pot life. Also, surface preparation of substrate boards prior to application of polyurethane based coatings is important, since even minute quantities of moisture on a substrate board could produce blistering under humid conditions. Blisters, in turn, may lead to electrical failures and mandate costly rework. Polyurethane coatings are insoluble in most common solvents, which is a drawback to rework. Thus, replacement of a component on a polyurethane coated board requires a corrosive stripper to remove effectively all traces of the polyurethane film. However, extreme caution must be exercised when such a stripper is used, because the stripper also may corrode metallic surfaces on the board.

Epoxy resin systems also have been employed by the prior art for conformal coating printed circuit boards. Epoxy resins are available as two component systems only. Epoxy resin coatings provide good humidity resistance and high abrasive and chemical resistance. However, epoxy resins are virtually impossible to remove chemically for rework because any stripper that will attack the coating also will attack the epoxy coating of potted electronic components and the epoxy-glass of the printed circuit board as well. Thus, the only effective way to repair an epoxy resin coated board is to burn through the epoxy coating with a hot knife or soldering iron. However, burning introduces a cosmetic defect which is unacceptable to many consumers. Moreover, epoxy resins shrink somewhat during cure. Accordingly, a buffer material must be placed around fragile electronic components to prevent fracturing from shrinkage. Curing of epoxy systems can be accomplished in one to three hours at elevated temperature, or four to seven days at room temperature. Epoxy resins exhibit a relativly short working pot life which is an additional disadvantage.

Silicone resins also have been employed by the prior art for conformal coating circuit boards. Silicone resin coatings provide high humidity and corrosion resistance along with high temperature resistance which makes silicone resins preferred for coating printed circuit assemblies that contain high heat-dissipating components such as power resistors. However, silicone resins are relatively thick making them somewhat difficult to apply. Moreover, silicone resins require a relatively long cure, and repairability is difficult since silicone resins once cured are essentially insoluble, and cannot be vaporized with the heat of a soldering iron. Accordingly, the only effective way to repair a silicone resin coated circuit board is to mechanically remove the coating.

The prior art also has employed polyimides for conformal coating circuit boards. Polyimide coatings provide high-temperature, moisture and chemical resistance over extended periods of time. However, polyimide coatings require high temperature cure (one to three hours at 200° to 250° C.) which could damage heat sensitive electronic components, and this requirement severely limits the use of polyimide coating systems on most printed circuit board assemblies. Also, since polyimides are high-temperature, moisture and chemical resistant, the only effective way to repair a polyimide coated board is to mechanically remove the coating.

Diallyl phthalate varnishes also have been proposed by the prior art for conformal coating circuit boards and provide excellent high temperature and chemical resistance. However, diallyl phthalate varnishes require high temperature cure (approximately 150° C.) which severely limits their use. And, diallyl phthalate coatings also typically must be mechanically removed to permit repair.

The preceeding discussion of background in the art of conformal coating circuit boards is taken largely from *Printed Circuits Handbook*, Clyde F. Coombs, Jr., Editor, McGraw Hill Book Company, Second Edition (1979).

As thus is apparent from the above discussion, none of the currently available conformal coating systems are completely satisfactory since all prior art conformal coating systems at best are a tradeoff of preferred application characteristics (i.e., processing speed, ease of application, pot life and cure conditions), preferred physical characteristics, (i.e., electrical properties, temperature, chemical and moisture resistance), and repairability.

It is thus a primary object of the present invention to provide an improved conformal coating system, i.e. method and materials which overcomes the aforesaid and other disadvantages of the prior art.

Other objects of the present invention are to provide an improved composition for conformal coating printed circuit board assemblies and the like which compositions demonstrate extended pot life and ease of application, rapid dry-to-touch cure, good electrical properties, superior adhesion and abrasion resistance, excellent high temperature, chemical and moisture resistance, and ease of repairability. Yet other objects will in part appear obvious and will in part appear hereafter.

The invention accordingly comprises the processes involving the several steps and relative order of one or more such steps with respect to each other, and the devices, materials and compositions possessing the features, properties and relations of elements which are exemplified in the following disclosure and scope of application of which will be indicated in the claims.

SUMMARY OF THE INVENTION

Generally, the foregoing and other objects of the invention are achieved by the provision of an ultraviolet (hereinafter "uv") curable polymerizable coating system having one or more secondary curing mechanisms built in. More specifically, in accordance with the invention the polymerizable system is a two component system comprising (1) a first component comprising at least one urethane-acrylate or methacrylate, a mono or polyfunctional reactive acrylate or methacrylate reactive diluent and a polymerization initiator of the photoinitiator type, and (2) a second component comprising a polyisocyanate adduct. The coating system is uv curable, and also possess at least one additional cure mechanism. A particular feature and advantage of the instant invention is that the uv radiation cure produces extremely rapid dry-to-the-touch cure of all exposed areas of the coating thereby permitting substantially immediate handling of the coated products and maintaining the shape of the coating which might otherwise sag and creep, while the secondary cure mechanism(s) provide substantially complete cure of unexposed (shadow) areas of the coating under conditions of ambient temperature and humidity.

For a fuller understanding of the nature and objects of the present invention, reference should be made to the following detailed description of the invention taken in connection with the accompanying examples.

The terms "liquid", and "solid" or "dry-to-the-touch" are used herein with reference to physical properties of the materials, are to be understood as to be referring to such properties as they exist under conditions as may be specified. For example, the term "liquid" refers to a physical state wherein a material is readily flowable while the terms "solid" and "dry-to-the-touch" are to be understood as referring respectively to physical states wherein a material is resistant to change in shape and is without free surface moisture or surface tackiness.

DETAILED DESCRIPTION OF THE INVENTION AND ITS PREFERRED EMBODIMENTS

Part A (THE MONOMER)

The urethane-acrylates or methacrylates employed in Part A of the two component system of the instant invention preferably comprise polyester-urethane-acrylates formed by reacting a polyester diol with a diisocyanate, and reacting the resulting product with a polymerizable acrylic or methacrylate acid ester. The preferred polyester diol is manufactured by the Inolex Company under the trade name Lexorez 1400-120. This polyester diol is formed by reaction of neopentyl glycol and 1,6-hexanediol with adipic acid. Other polyester diols useful are formed by the reaction of neopentyl glycol and a diol of more than 3 carbon atoms, e.g., 1-4-butanediol with adipic acid. Other polyesters found useful include adipates of 1,4 butane diol and 1,6 hexane diol as well as polycapralactone diols of similar molecular weight. The preferred diisocyanate is toluene diisocyanate (TDI) although other relatively low molecular weight diisocyanates of the general formula:

$$(O=C=N)_2R \qquad (I)$$

wherein R is a $C_{2-20}$ alkylene, alkenylene or cycloalkylene radical or a $C_{6-40}$ arylene, alkarylene or aralkylene are useful.

The reaction ratio of the equivalent weights of the polyester diol to the diisocyanate should generally be in the range of about 1.0 of polyester diol to about 1.7 to about 2.2 of diisocyanate. The preferred reaction ratio is 1.0 equivalents of the polyester diol for every 1.9 equivalents of diisocyanate. This preferred reaction ratio is particularly important to the properties of the final composition. The 1:1.9 ratio yields a composition with a chemical structure having a high degree of flexibility and stability. The copolymer formed is generally of a random copolymer structure. This copolymer product is then reacted with an hydroxyl-containing acrylate or methacrylate ester monomer, producing acrylate endcapping. The useful range of equivalents of the ester monomers is about 0.9 to about 3.0, the preferred being in the range of 1.6 to 2.0, and the most preferred being 1.8 equivalents.

The polymerizable acrylate and methacrylate ester monomers used to cap the polyester diisocyanate reaction product may be mono- or difunctional. Mono-functional monomers are preferred. Those monofunctional monomers found most effective are selected from the group consisting of hydroxyalkyl acrylates and methacrylates, amino alkyl acrylates and methacrylates. The most preferred polymerizable ester monomers are hydroxyethyl methacrylate and hydroxypropyl methacrylate. Additional monofunctional polymerizable ester monomers deemed useful are represented by the following formula:

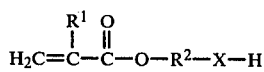

(II)

wherein X is —O— or

$R^3$ is hydrogen or lower alkyl of 1 to 7 carbon atoms; $R^1$ is selected from the group consisting of hydrogen, chlorine and methyl and ethyl radicals; and $R^2$ is a divalent organic radical selected from the group consisting of lower alkylene of 1-8 carbon atoms, phenylene and naphthylene.

Suitable hydroxy- or amine-containing materials are exemplified by, but not limited to, such materials as hydroxyethyl acrylate, hydroxyethyl methacrylate, aminoethyl methacrylate, 3-hydroxypropyl methacrylate, aminopropyl methacrylate, hydroxyhexyl acrylate, t-butylaminoethyl methacrylate, hydroxyoctyl methacrylate, and the monoacrylate or monomethacrylate esters of bisphenol-A, the fully hydrogenated derivative of bisphenol-A, cyclohexyl diol, polyethyleneglycol methacrylate, and the like.

The end-capping reaction may be accomplished in the presence or absence of diluents. Diluents which include the hydrocarbons such as aliphatic, cycloaliphatic and aromatic hydrocarbons, for example, benzene, toluene, cyclohexane, hexane, heptane, and the like, may be employed, but other diluents, such as methyl isobutyl ketone and diamyl ketone, can also be utilized. Alternatively, the diluent may comprise a mono or polyfunctional acrylate or methacrylate reactive diluent.

Ultraviolet ("uv") activated polymerization initiators are incorporated into Part A of the coating system. Many uv activated polymerization initiators are known in the art and may be incorporated directly into the urethane-acrylate monomer or methacrylate. For example, the uv activated initiators may be selected from metal carbonyls of the formula $M_x(CO)_y$ wherein M is a metal atom, x is 1 or 2, and y is an integer determined by the total valence of the metal atoms, generally 4 to 10.

The preferred uv activated initiators are selected from (a) $C_{1-16}$ straight or branched chain alkyl diones; and (b) carbonyl compounds of the general formula $R^4(CO)R^5$ wherein $R^4$ is a $C_{1-10}$ alkyl, aryl, aralkyl or alkaryl group, and $R^5$ is $R^4$ or hydrogen. In addition, $R^4$ or $R^5$ can contain any substituents which do not adversely effect the compound in serving its function. For example, R or $R_1$ can be alpha-substituted with an alkyl, aryl, alkaryl alkoxy or aryloxy radical, or with an amino or a mono- or dialkylamino derivative thereof, each of the above substituents containing up to about six carbon atoms. In addition, $R^4$ and $R^5$ taken together with carbonyl group form an aromatic or heterocyclic ketone containing up to about 16 carbon atoms.

The polymerization initiators are usually employed in amounts of about 1% to about 10% by weight of the urethane-acrylate or -methacrylate containing part (hereafter Part A) of the coating system.

As mentioned supra, also included in the first component (Part A) of the coating system is a mono or polyfunctional acrylate or methacrylate reactive diluent.

The mono or polyfunctional acrylate or methacrylate reactive diluents which may be used in the reactive diluent in the coating system of the present invention comprise allylic-bond containing acrylates or methacrylates of the formula:

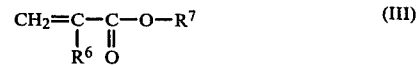

(III)

in which $R^6$ is a radical selected from the group consisting of hydrogen and lower alkyl of 1 to 4 carbon atoms, and $R^7$ is an organic radical containing at least one allylic bond and does not contain any group which may adversely affect the coating system for purposes of disclosed herein. Preferably $R^7$ will consist of an allylic-bond containing aliphatic or substituted aliphatic carbon ring structure of which dicyclopentenyloxyethyl is presently preferred. Other allyic-bond containing carbon ring structures such as dicyclopentenyl which is given as exemplary may also be advantageously employed.

This reactive diluent, which is usually employed in amounts of about 30% to about 70% by weight of Part A of the coating system may be added during the end-capping reaction step as previously described, or the proportions mentioned above made up at this time in the preparation.

It is useful, but not required to incorporate an adhesion promoter into Part A of the coating system. The adhesion promoter may be chosen from any of those commonly known to the person reasonably skilled in the art. Two types of promoters are preferred. The first type consists of mono- and dicarboxylic acids which are capable of copolymerizing with the acrylate or methacrylate ester monomer. The preferred species of these classes are methacrylic and acrylic acid. Such acids are used in proportions of 1-20% by weight of part one of the coating system, preferably in proportion of 1-15%. The second preferred type of adhesion promoter is of the well-known silane type, present in the composition in proportions of 1-10% by weight of part one of the coating system.

It is optional, but recommended, that chelators, cross-linking agents and inhibitors also be added to Part A of the coating system for optimum performance. Chelators and inhibitors are effective in amounts of about 0.1 to about 1% by weight of Part A of the coating system. Ethylenediamine tetra-acetic acid and its sodium salt ($Na_4EDTA$), 1,1-ethylenebis-nitril methylidyne dipyridine and the class of beta-diketones are generally the most effective and are preferred. Cross-linking agents, optionally present in amounts up to about 10% by weight of Part A of the coating system, include such compounds as copolymerizable dimethacrylates.

The inhibitor concentration left over in the monomers from manufacture is often high enough for good stability. However, to insure maximum shelf life, the proportions mentioned above (about 0.1 to about 1% by weight of Part A of the coating system) are recommended. Of those inhibitors which have been found of adequate utility is the group consisting of hydroquinones, benzoquinones, naphthoquinones, phenanthraquinones, anthraquinones, and substituted compounds of any of the foregoing. Additionally, various phenols can be employed as inhibitors, the preferred one being 1,6-di-tert-butyl-4-methyl phenol.

The amount of thickness, viscosity, or thixotropy desired can be varied in accordance with the particular application required. Thickeners, plasticizers, diluents, and various other agents common to the art can be employed in any reasonable manner to produce the desired characteristics.

It also is optional, but recommended, that surfactants be included in Part A of the adhesive composition for optimum performance. The preferred surfactants are non-ionic surfactants having pendant free hydroxyl groups. One such class of useful non-ionic surfactants is the ethoxylatated alkyl (linear or branch) phenols. These typically have the formula

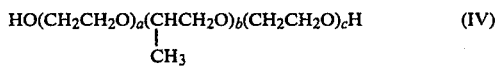
(IV)

wherein a, b and c are integers such that the molecular weight of the compound is in the range of about 500 to about 30,000, and units plus c comprise about 10 to 80 percent by weight of the final molecular weight. Such compounds are sold by BASF Wyandotte, Wyandotte, Michigan under the trademark "Pluronic." Another example of this class on non-ionic surfactants are the polyoxyalkalene silicones sold by Union Carbide, New York, New York, under the trade name L-5320.

The above-mentioned surfactants all contain pendent free hydroxyl groups, which groups as will be explained in detail hereafter, are available to react with free isocyanate contained in Part B of the coating system. It will be appreciated that the above-mentioned surfactants are merely representative of useful surfactants available and are not intended to comprise an inclusive list. Selection of suitable surfactants is a matter of simple experimentation. Obviously the surfactant must be soluble in the monomer composition. This obviously can be quite readily determined for any concentration contemplated.

Surfactant concentration will depend in any given case upon the particular surfactant and monomer composition being used. Optimization will be a matter of routine experimentation within the skill of the art. Ordinarily, however, minimum concentration of about 0.25 percent surfactant by weight of Part A of the coating composition will be needed to achieve an acceptable degree of emulsifiability, and a concentration of at least about 0.5 percent by weight usually will be preferred. The maximum surfactant concentration will usually be about five percent by weight since above this level the surfactant may begin to interfere with the properties of the coating composition by adversely affecting, for example, its cure rate, stability or the cured products. As a practical matter, an upper concentration limit of about five percent, is usually satisfactory. For most surfactants or combinations of surfactants, the optimum concentration will probably fall in the range of about 1.0 to 2.5 percent by weight of the total coating composition.

THE ACTIVATOR

Part B (THE ACTIVATOR)

The activator employed as Part B of the coating system of the present invention comprises a polyisocyanate adduct of aromatic or alphatic isocyanates, or mixture thereof. The polyisocyanates which may be used as Part B may be generally represented by the formula $(O=C=N)_nQ$, in which n is an integer from 2 to about 20, preferably 2 to about 5, and Q is an organic radical having a molecular weight up to about 5000 and a bonding capacity equal to n. A preferred class of polyisocyanates are those of the formula:

(V)

wherein n is 2 and $R^6$ is a $C_{2-20}$ alkylene, alkenylene or cycloalkylene radical or a $C_{6-40}$ arylene, alkarylene, aralkarylene, alkyloxyalkylene or aryloxyarylene radical which may be substituted by 1–4 chlorine atoms or by 1–3 amino or mono- or di-$C_{1-3}$-alkylamino or $C_{1-3}$ alkoxy groups.

Typical examples of such polyisocyanates are toluene diisocyanate, 4,4'-diphenyl diisocyanate, 4,4'-diphenyl methane diisocyanate, dianisidine diisocyanate, 1,5-naphthalene diisocyanate, 4,4'-diphenyl ether diisocyanate, tetramethylene diisocyanate, hexamethylene diisocyanate, ethylene diisocyanate, cyclohexylene diisocyanate, nonamethylene diisocyanate, octadecamethylene diisocyanate, 2-chloropropane diisocyanate, 2,2'-diethyl-ether diisocyanate, 2-(dimethylamino)pentane diisocyanate, tetrachlorophenylene-1,4-diisocyanate, 3-heptene diisocyanate and transvinylene diisocyanate. The preferred polyisocyanate adduct is manufactured by the Mobay Chemical Corporation under the trade name MONDUR CB-75. This polyisocyanate is an aromatic polyisocyanate dissolved in ethyl acetate having a solid content percent of about 75 percent, NCO content of approximately 12.5 to 13.5 percent, equivalent weight of 323 average and containing a maximum of about 0.7 percent free monomer based on resin solids.

The proportions in which the reactants, Part A and Part B, may be combined can be varied relatively widely; however, it is generally preferred to employ the reactants in proportions such that the polyisocyanate is in substantial chemical equivalent excess, e.g. at least 2:1 and up to about 10:1 or more. The preferred range is about 5:1 to 7:1, most particularly about 6:1. (As used herein the expression "chemical equivalent amount" refers to the amount needed to furnish one isocyanate group per hydroxy group.)

As will be appreciated the coating system of the present invention is designed primarily as a uv curing product; however, due to the configuration of many circuit boards, there are areas that cannot be cured by a uv light. These areas, the so-called "shadow areas", are located on the board such that some other component, or a surface wire or connector interferes with the direct exposure to the uv source. To overcome this deficiency, the coating system of the present invention provides one or more additional built-in curing mechanisms. For example, in the case of the two-component coating system at least five additional curing mechanisms potentially are available to complete curing of the coating. These mechanisms are as follows:

(1) The polyester urethane dimethacrylate of Part A of the system contains excess hydroxyethylmethacrylate (HEMA), the hydroxy functionality of which is available for reaction with the free isocyanates contained in the activator Part B thereby forming urethane linkages, i.e. according to the formula:

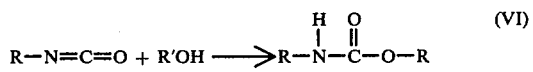
(VI)

(2) Pendent free hydroxyl groups contained in the surfactant of Part A are available to react with free isocyanate in the activator Part B forming urethane linkages according to formula (IV), thereby chemically bonding the surface layer to the bulk of the coating.

(3) Free isocyanate in the activator Part B can react with water, specifically atmospheric moisture, cross-linking through the formation of di-substituted ureas, i.e. according to the following formula:

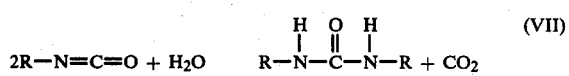

(4) Free isocyanate in the activator Part B can react with previously formed urethane groups to form allophanates, thus increasing cross-linking density, i.e. according to the following formula:

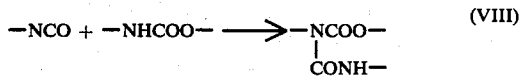

(5) Free isocyanate in the activator can react with previously formed urea groups to form biurets, thus increasing cross-link density according to the following formula.

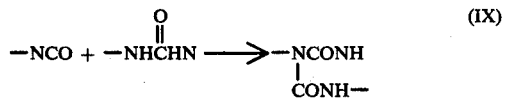

Additionally, all five of the aforesaid curing mechanisms are catalyzed by heat, and since most uv sources also generate intense I.R. waves, an excellent heat source is immediately available to help drive the secondary curing mechanisms. Therefore, in many instances, significant portions of the "shadow areas" will be cured during the uv exposure. Experiments have shown that areas that do not co-cure substantially immediately during uv exposure will dry hard and dry-to-the-touch within 2 to 24 hours under conditions of ambient temperature and average relative humidity.

To facilitate post-cure mechanism even further, a third curing mechanism is available with the two component system. More particularly, by selecting methacrylate monomers in Part A which contain not only a reactive methacrylate group, but a second point of unsaturation—the allyl bond, a significant level of cross-linking may occur when appropriate metal dryers are added to Part B of the system. Useful metal-dryers include salts of metals with a valence of two or greater and unsaturated organic acids. Amongst suitable compounds are mentioned the linoleates, naphthenates and resinates of cobalt, manganese, serium, lead, chromium, iron nickel, uranium and zinc. The metal dryers are usually employed in concentrations of less than between about 0.01 and five percent by weight of Part B. In cases where the isocyanate related post-cure is hampered by the lack of heat or atmospheric moisture, cross-linking of the allyl bond on the monomer typically will provide a tack-free coating in twenty-four hours.

It is frequently desirable to add low levels, such as up to about 500 parts per million by weight, of a free-radical or uv stabilizer, many of which are known in the art, to prevent spurous polymerization of the composition prior to the time of its intended use. Suitable free-radical stabilizers are hydroquinone, p-benzoquinone, butylate of hydroxytoluene, and butylate of hydroxyanisole.

EXAMPLE I

The invention will now be illustrated by the following description of a specific preferred embodiment thereof, given by way of example only.

PREPARATION

Part A

A nitrogen-swept, four-necked uv shielded resin kettle equipped with a stainless steel stirrer, nitrogen inlet tube, thermometer, condensor, and entrance port, was heated to approximately 40° C., 165 grams of MOBAY TDI toluene diisocyanate added, and 460 grams of 1,6-hexanediol/neopentyl glycol adipate (Inolex 1400-120 polyester, Inolex Company, Philadelphia, PA) was slowly added—460 grams over 20 minutes. At the completion of the polyester addition, heating was continued with stirring (40° to 45° C. temperature) for one hour, followed by two hours heating with stirring at 100° C. Upon completion of the three hour reaction period, the bath temperature was lowered to 50° C., and 230 grams of hydroxyethylmethacrylate was added. The reaction mixture was then heated, maintained at 50° C. and stirred for two hours at that temperature. Six grams of isopropanol, 0.18 grams of sodium EDTA and 100 grams of Ciba-Geigy Irgacure 651 dimethoxy-2-phenyl acetophenol were added to the reaction mixture, the reaction mixture permitted to cool to room temperature and stirred for one-half hour at room temperature.

To the reaction mixture was then added, with stirring, 1378 grams of Rohm and Haas QM-657 dicyclopentenyloxyethyl methacrylate, 146 grams of Rohm and Haas acrylic acid, 28 grams of Union Carbide 1-29 silane and 2.5 grams of Union Carbide L-5320 (Poly)oxyalkalene silicone surfactant.

The resulting solution contained approximately 34 percent concentration of polyester-urethane-methacrylate resin (PEUMA).

Part B

Part B of the coating system was prepared by dissolving 1757 grams of polyisocyanate adduct (MONDUR-CB-75) available from Mobay Chemical Corporation, Pittsburgh, PA. (the manufacturer describes this material as comprising an aromatic polyisocyanate adduct dissolved in ethyl acetate having percent solid of about 75 percent solids, NCO content of approximately 12.5-13.5 percent, an average equivalent weight of 323 and containing a maximum of 0.7 percent free diisocyanate monomer based on resin solids) in 3262 grams of 1, 1, 1-trichoroethane.

WORKING EXAMPLE

Blend solutions Part A and B prepared as above, and spray the resulting blend onto the top side surface (i.e. component side surface) of a printed circuit board. Cure of the coating was effected by exposing the boards to uv radiation (3650 angstroms, 60,000 microwatts per square centimeter). Those areas of the coating exposed to uv radiation were solid and dry to the touch within 10-45 seconds. Areas in the shadow of components, i.e. not receiving direct uv radiation, however, were observed to be wet to the touch, but found to be fully cured after standing at ambient temperature and humidity conditions for 24 hours. Circuit boards were sliced through shadow areas after 24 hours and the coating was found to be fully cured to the board.

Coated boards were placed on a rack in a stainless steel tank, and 500 grams of water added to the bottom of the tank. The tank was closed, sealed, and heated to a temperature of 115° C. After heating for 40 hours, the tank was allowed to cool, the tank was then opened and the boards removed and examined. No visible blistering or other evidence of coating failure was observed.

EXAMPLE II

Example I was repeated except 1300 grams of Alcolac SIPOMER DCPM dicylopentenyl methacrylate was used in Part A of the formulation in place of the dicyclopentenyloxyethyl methacrylate. Similar results to Example I were obtained.

EXAMPLE III

The procedure of Example I was repeated except 1400 grams of lauryl methacrylate was employed in place of the hydroxyethylmethacrylate of Part A of the formulation. Minor blistering of coating observed following 40 hours of heating in closed tank.

EXAMPLE IV

The purpose of this Example is to show the effect of using a different reactive diluent. The procedure of Example I was repeated except 1600 grams of hydroxyethylmethacrylate was used in Part A of the formulation in place of the dicyclopentenyl oxyethyl methacrylate. Similar results to Example I were obtained. Minor blistering of coating observed following 40 hours of heating in closed tank.

EXAMPLE V

Example V was repeated except 1600 grams of Mobay Chemical Corporation DESMODUR E-21 polyisocyanate (available as one hundred percent solids, NCO content of approximately 16, average equivalent weight of 262) was employed in place of the MONDUR-CB-75. Similar results to Example I were obtained.

As will be appreciated the foregoing invention provides novel and improved coating systems for conformal coating printing circuit boards and the like. The coating systems may be applied to a circuit board assembly by any convenient manner, for instance a spraying, brushing, dripping, rolling, dipping, etc. Moreover, the coating systems cure through multiple mechanisms including uv cure which permits fast fixture cure thereby achieving almost immediate dry-to-the-touch curing. However, unlike conventional uv cured products, the coating systems of the present invention do not require full area irradiation to achieve full cure due to their built-in secondary cure mechanisms. Moreover, the cured coatings have excellent adherence to plastics, metal, glass and wood, good abrasion resistance, and are hydrolytically stable and resistant to thermal cycling. The coatings also are repairable, i.e., can be removed by selective solvents such as methylethylketone, and then replaced by brush or spray, and uv cured.

The invention has been described particularly with application to conformal coating circuit board assemblies. However, one skilled in the art would appreciate that the coating systems may be applied to other electrical electronic components such as transformers or the like. Moreover, the coating composition is not limited to the use in the electronics field but may be employed in any industrial area where conformal protective coating is desired.

I claim:
1. A two-part coating composition, especially useful for conformal coating, comprising:
   (1) a first part comprising at least one urethane-acrylate or urethane-methacrylate compound, a mono or polyfunctional acrylate or methacrylate reactive diluent and a polymerization initiator of the photo-initiator type; and
   (2) a second part comprising a polyisocyanate containing adduct,
   at least one component of said first part containing unreacted hydroxyl groups, said composition having an equivalent weight excess of isocyanate groups in said second part to the hydroxyl groups in said first part of at least 2:1.
2. The coating composition of claim 1, wherein said urethane-acrylate or urethane methacrylate compound comprises a polyester-urethane-acrylate or a polyester urethane methacrylate.
3. The coating composition of claim 2, wherein the polyester portion of said polyester-urethane-methacrylate comprises a polyester diol.
4. The coating composition of claim 3, wherein said polyester diol comprises the reaction product of neopentyl glycol and 1,6-hexanediol with adipic acid.
5. The coating composition of claim 1, and further comprising a non-ionic surfactant.
6. The coating composition of claim 5, wherein said non-ionic surfactant contains pendant free hydroxyl groups.
7. The coating composition of claim 6, wherein said non-ionic surfactant comprises a polyoxyalkene silicone.
8. The coating composition of claim 1, wherein said acrylate or methacrylate reactive diluent contains at least one reactive allylic bond.
9. The coating composition of claim 1, wherein said reactive diluent comprises from about 30% to about 70% by weight of said first part.
10. The coating composition of claim 1 wherein said polyisocyanate is present in equivalent weight excess in the range of about 2:1 to about 10:1.
11. The coating composition of claim 1 wherein said polyisocyanate is present in equivalent weight range excess in the range of about 5:1 to about 7:1.
12. The coating composition of claim 10 wherein said polyisocyanate is present in equivalent weight excess of about 6:1.
13. A method of forming a UV curing polymerizable conformal coating on a substrate wherein said substrate has one or more shadow areas, comprising the steps in sequence of:
   (1) providing a two-part coating composition, the first part of which comprises at least one urethane-acrylate or urethane-methacrylate compound, a mono or polyfunctional acrylate or methacrylate reactive diluent and a polymerization initiator of the photo-initiator part, and a second part which comprises a polyisocyanate containing adduct at least one component of said first part containing unreacted hydroxyl groups, said composition having an equivalent weight excess of isocyanate groups in said second part to the hydroxyl groups in said first part of at least 2:1;
   (2) blending said first and second parts to form a coating composition;
   (3) applying said coating composition to said substrate;

(4) exposing the coated substrate to UV light wave length and intensity to effect UV cure of exposed areas of said coating; and (5) storing said coated substrate under conditions of temperature and humidity such as to promote curing of unexposed (shadow) areas of said coating through a built-in secondary moisture cure mechanism.

14. A method according to claim 13, wherein said substrate comprises a circuit board, and wherein said circuit board has one or more components mounted thereon overshadowing areas of said circuit board.

15. A printed circuit board having one or more components mounted thereon, and covered at least in part with the cured coating composition of claim 1.

* * * * *